United States Patent
Lin

(10) Patent No.: US 8,823,388 B2
(45) Date of Patent: Sep. 2, 2014

(54) CALIBRATION CIRCUIT AND CALIBRATION METHOD

(75) Inventor: Yu-Wei Lin, New Taipei (TW)

(73) Assignee: Solid State System Co., Ltd., Hsinchu (TW)

(*) Notice: Subject to any disclaimer, the term of this patent is extended or adjusted under 35 U.S.C. 154(b) by 578 days.

(21) Appl. No.: 13/152,284

(22) Filed: Jun. 3, 2011

(65) Prior Publication Data
US 2012/0306557 A1 Dec. 6, 2012

(51) Int. Cl.
*G01R 35/00* (2006.01)
*G01R 23/175* (2006.01)
*H03H 7/32* (2006.01)
*G01R 31/317* (2006.01)
*H03H 11/26* (2006.01)
*H03H 7/01* (2006.01)

(52) U.S. Cl.
CPC ............ *H03H 7/32* (2013.01); *G01R 35/00* (2013.01); *G01R 31/31725* (2013.01); *H03H 7/0153* (2013.01); *H03H 11/265* (2013.01); *H03H 2210/043* (2013.01)
USPC ......................................... 324/601; 324/76.54

(58) Field of Classification Search
CPC ........ H03H 11/26; G01R 23/00; G01R 23/02; G01R 25/00; G01R 35/005; G01R 35/00; G01R 31/31725

USPC .............................................. 324/601, 76.54
See application file for complete search history.

(56) References Cited

U.S. PATENT DOCUMENTS

| | | | | |
|---|---|---|---|---|
| 6,417,715 B2* | 7/2002 | Hamamoto et al. | ........... | 327/291 |
| 7,024,324 B2* | 4/2006 | Rifani et al. | ................... | 702/79 |
| 7,642,825 B2* | 1/2010 | Maeda | ........... | 327/158 |
| 7,759,990 B2* | 7/2010 | Miike | ........... | 327/147 |
| 7,977,980 B2* | 7/2011 | Deppe et al. | ................... | 327/100 |
| 8,049,545 B2* | 11/2011 | Kim et al. | ................... | 327/158 |
| 8,411,517 B2* | 4/2013 | Choi | ........... | 365/194 |

* cited by examiner

*Primary Examiner* — Amy He
(74) *Attorney, Agent, or Firm* — Jianq Chyun IP Office

(57) ABSTRACT

A calibration circuit and a calibration method are provided. The calibration circuit has a delay circuit, a phase detector, and a controller. The delay circuit delays an input signal to output an output signal, wherein a delay time between the input signal and the output signal is related to an equivalent capacitance and an equivalent resistance of the delay circuit. The phase detector coupled to the delay circuit compares the phases of the input signal and the output signal. The controller coupled to the delay circuit and the phase detector generates a control signal according to the comparison result of the phase detector to adjust the equivalent resistance of the delay circuit.

8 Claims, 7 Drawing Sheets

CALIBRATION CIRCUIT AND CALIBRATION METHOD

BACKGROUND OF THE INVENTION

1. Field of the Invention

The invention generally relates to a calibration circuit and a calibration method, and more particularly, to a calibration circuit and a calibration method which can calibrate an internal resistance without referring to the resistance of an external resistor.

2. Description of Related Art

A high-speed transceiver usually uses an on-die resistor as its termination, and the resistance of the on-die resistor usually needs to be calibrated for the sake of impedance matching. Conventionally, the resistance of an on-die resistor is usually calibrated according to the resistance of an off-chip resistor.

FIG. 1 is a diagram of a conventional calibration circuit 100. Referring to FIG. 1, the calibration circuit 100 calibrates the equivalent resistance of the resistor unit 140 according to the resistance of the off-chip resistor Rext, so as to make the equivalent resistance of the resistor unit 140 equal to the resistance of the off-chip resistor Rext. The calibration circuit 100 has an operational amplifier 110, a low-pass filter 120, and a counter 130. When the calibration circuit 100 starts calibrating the equivalent resistance of the resistor unit 140, the gates of the transistors M1 and M2 are turned on by the gate voltage $V_G$. As shown in FIG. 1, the sources of the transistors M1 and M2 are coupled to a first system voltage VDD, and the off-chip resistor Rext is coupled between the drain of the transistor M1 and the second system voltage VSS. The terminal voltages V1 and V2 of the off-chip resistor Rext and the resistor unit 140 are respectively sent to the positive input terminal and the negative input terminal of the operational amplifier 110. When the terminal voltage V1 is higher than the terminal voltage V2, the operational amplifier 110 outputs a positive voltage, and when the terminal voltage V1 is lower than the terminal voltage V2, the operational amplifier 110 outputs a negative voltage. The low-pass filter 120 low-pass filters the output signal of the operational amplifier 110 to generate a pull-up signal $S_{UP}$ and a pull-down signal $S_{DN}$. The counter 130 generates a (N+1)-bit control signal S[0:N] according to the pull-up signal $S_{UP}$ and the pull-down signal $S_{DN}$ to control the (N+1) transistors of the resistor unit 140. The (N+1) transistors of the resistor unit 140 are respectively connected with the corresponding resistors $R_0$-$R_N$ in series. The equivalent resistance of the resistor unit 140, and accordingly the terminal voltage V2, changes along with the on/off of the N transistors. When the terminal voltage V1 is eventually equal to the terminal voltage V2, the equivalent resistance of the resistor unit 140 is equal to the resistance of the off-chip resistor Rext.

However, a system on chip (SOC) requires an exclusive pin to be coupled to the off-chip resistor Rext. The additional pin and the off-chip resistor will increase the overall cost of the SOC.

SUMMARY OF THE INVENTION

Accordingly, the invention is directed to a calibration circuit and a calibration method, wherein an input signal is delayed for a predetermined delay time so that an internal resistance can be precisely calibrated without referring to the resistance of an off-chip resistor.

The invention provides a calibration circuit including a delay circuit, a phase detector, and a controller. The delay circuit delays an input signal to output an output signal, wherein a delay time between the input signal and the output signal is related to an equivalent capacitance and an equivalent resistance of the delay circuit. The phase detector coupled to the delay circuit compares the phases of the input signal and the output signal to generate a comparison result. The controller coupled to the delay circuit and the phase detector generates a control signal according to the comparison result of the phase detector, so as to adjust the equivalent resistance of the delay circuit.

The invention provides a calibration method for calibrating an equivalent resistance of a delay circuit. The calibration method comprises providing an input signal and delaying the input signal through the delay circuit to output an output signal, wherein a delay time between the input signal and the output signal is related to an equivalent capacitance and the equivalent resistance of the delay circuit. The calibration method also comprises comparing the phases of the input signal and the output signal to generate a comparison result. The calibration method further comprises adjusting the equivalent resistance of the delay circuit according to the comparison result.

According to an embodiment of the invention, the delay circuit has a delay unit. The delay unit comprises a first variable resistor, a second variable resistor, a first capacitor, a second capacitor, a first switch, a second switch, and a current source. The first variable resistor is coupled to a first system voltage, and the resistance of the first variable resistor is controlled by the control signal. The second variable resistor is coupled to the first system voltage, and the resistance of the second variable resistor is also controlled by the control signal. A first end of the first capacitor is coupled to the first variable resistor for outputting a signal complementary to the input signal, and a second end of the first capacitor is coupled to a second system voltage. A first end of the second capacitor is coupled to the second variable resistor for outputting the output signal, and a second end of the second capacitor is coupled to the second system voltage. A first terminal of the first switch is coupled to the first variable resistor and the first end of the first capacitor, and a control terminal of the first switch receives the input signal. A first terminal of the second switch is coupled to the second variable resistor and the first end of the second capacitor, and a control terminal of the second switch receives the signal complementary to the input signal. A first terminal of the current source is coupled to a second terminal of the first switch and a second terminal of the second switch, and a second terminal of the current source is coupled to the second system voltage.

According to an embodiment of the invention, the delay circuit has a plurality of delay units connected with each other. Each of the delay units comprises a first variable resistor, a second variable resistor, a first capacitor, a second capacitor, a current source, a first switch, and a second switch. The first variable resistor is coupled to a first system voltage, and the resistance of the first variable resistor is controlled by the control signal. The second variable resistor is coupled to the first system voltage, and the resistance of the second variable resistor is also controlled by the control signal. A first end of the first capacitor is coupled to the first variable resistor, and a second end of the first capacitor is coupled to a second system voltage. A first end of the second capacitor is coupled to the second variable resistor, and a second end of the second capacitor is coupled to the second system voltage. A first terminal of the first switch is coupled to the first variable resistor and the first end of the first capacitor, a second terminal of the first switch is coupled to a first terminal of the current source, and a control terminal of the first switch receives the input signal or is coupled to the first end of the second capacitor of one of the delay units. A first terminal of the second switch is coupled to the second variable resistor and the first end of the second capacitor, a second terminal of the second switch is coupled to the first terminal of the current source, and a control terminal of the second switch receives a signal complementary to the input signal or is coupled to the first end of the first capacitor of one of the delay units. The current source provides a current, and a second terminal of the current source is coupled to the second system voltage.

According to an embodiment of the invention, the control signal is a digital signal having a plurality of bits. The first variable resistor and the second variable resistor respectively include a plurality of resistor units. Each of the resistor units comprises a resistor and a switch, wherein the switch is connected with the resistor in series and is controlled by a corresponding bit of the control signal.

According to an embodiment of the invention, the calibration circuit further comprises a phase locked loop coupled to the delay circuit. The phase locked loop receives a reference signal to generate and output the input signal to the delay circuit.

According to an embodiment of the invention, the calibration circuit further comprises an input buffer coupled between the phase locked loop and the delay circuit. The input buffer buffers the input signal input to the delay circuit.

According to an embodiment of the invention, the controller comprises a low-pass filter and a counter. The low-pass filter is coupled to the phase detector and configured to low-pass filter the output of the phase detector. The counter is coupled between the low-pass filter and the delay circuit and configured to output the control signal according to the output of the low-pass filter.

According to an embodiment of the invention, the input signal and the output signal are respectively a clock signal.

According to an embodiment of the invention, the step of adjusting the equivalent resistance of the delay circuit according to the comparison result comprises adjusting the equivalent resistance until the delay time is equal to a predetermined delay.

According to an embodiment of the invention, the predetermined delay is equal to N times of a half of the period of the input signal, wherein N is a positive integer.

As described above, in the invention, whether an input signal has been delayed for a predetermined delay, and accordingly, whether the equivalent resistance of a delay circuit has been calibrated to an expected value, is determined by using a phase detector. Since no additional off-chip resistor is required to calibrate the equivalent resistance of the delay circuit, no additional pin for coupling aforementioned off-chip resistor needs to be disposed. Thereby, the calibration circuit in the invention is very suitable to a system on chip (SOC).

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
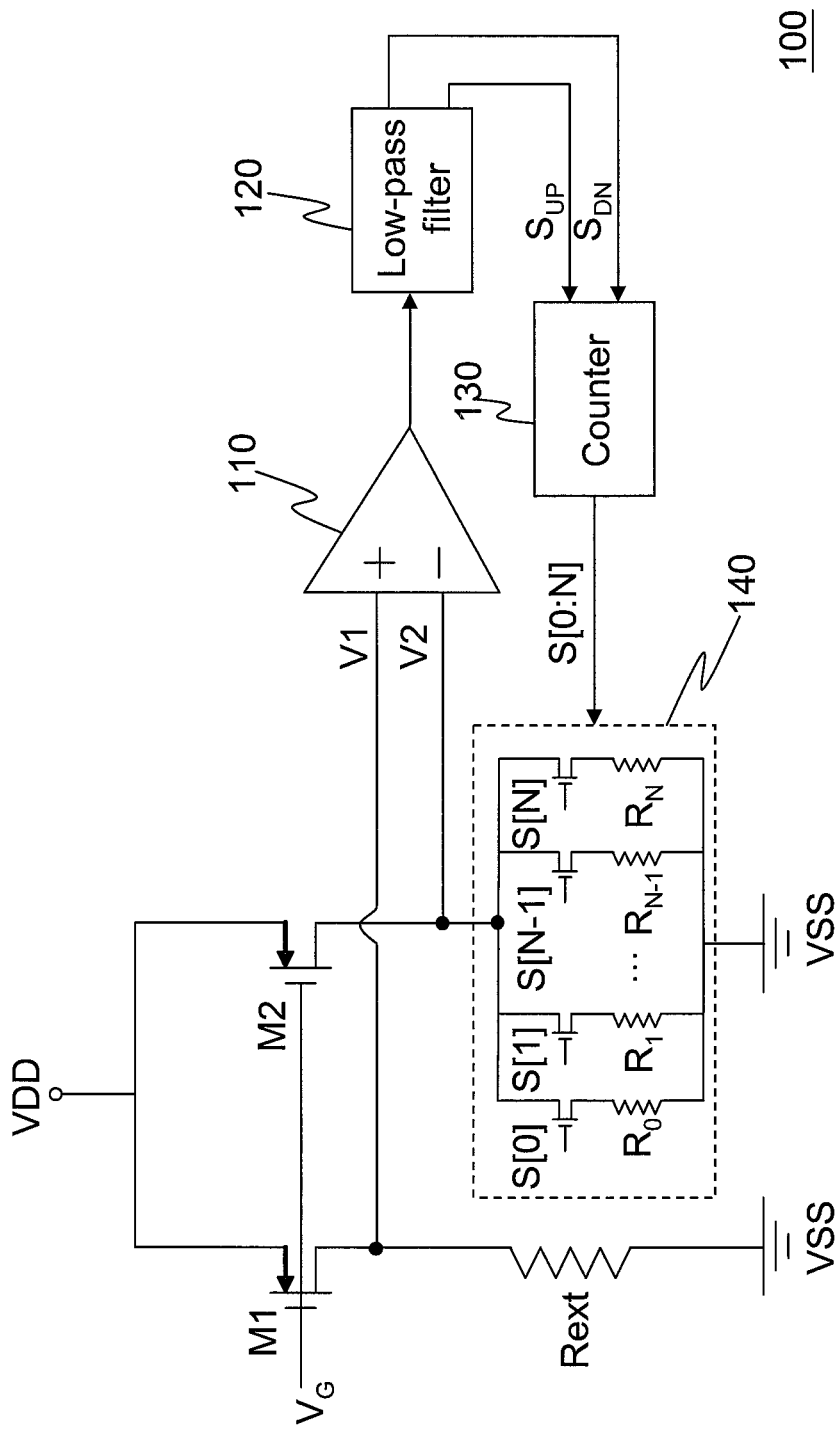
FIG. 1 is a diagram of a conventional calibration circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
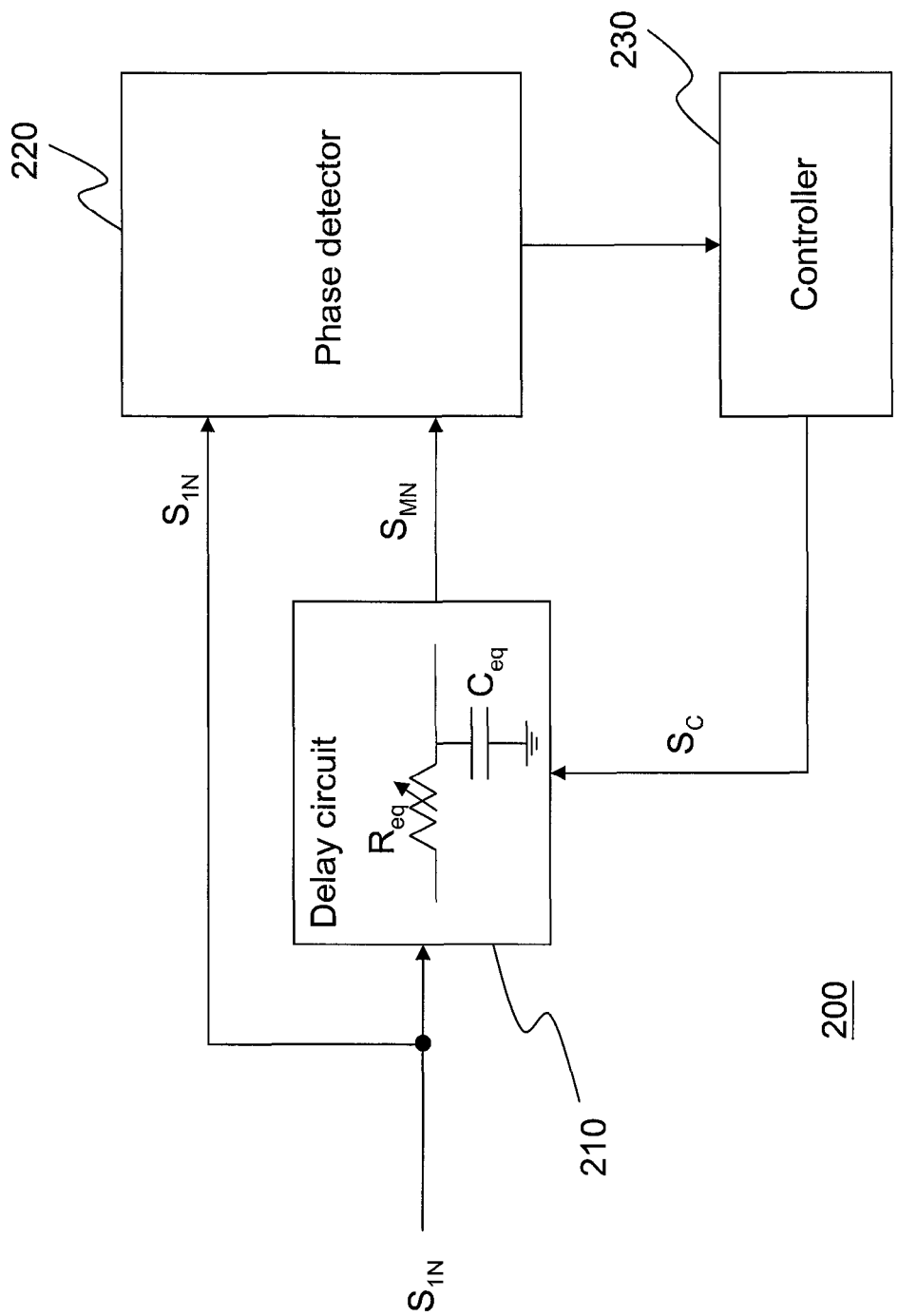
FIG. 2 is a functional block diagram of a calibration circuit according to an embodiment of the invention.

FIG. 2 is a functional block diagram of a calibration circuit 200 according to an embodiment of the invention. Referring to FIG. 2, the calibration circuit 200 comprises a delay circuit 210, a phase detector 220, and a controller 230. The delay circuit 210 delays an input signal $S_{IN}$ to output an output signal $S_{MN}$. The phase detector 220 is coupled to the delay circuit 210 and configured to compare the phases of the input signal $S_{IN}$ and the output signal $S_{MN}$. The controller 230 is coupled to the delay circuit 210 and the phase detector 220 and configured to generate a control signal $S_C$ according to the comparison result of the phase detector 220.

The delay circuit 210 is considered a resistor-capacitor (RC) circuit, which is indicated with an equivalent resistor $R_{eq}$ and an equivalent capacitor $C_{eq}$. The resistance of the equivalent resistor $R_{eq}$ is controlled by the controller 230. To be specific, the controller 230 sends the control signal $S_C$ to the delay circuit 210 to change the resistance of the equivalent resistor $R_{eq}$ (i.e., the equivalent resistance of delay circuit 210), and when the resistance of the equivalent resistor $R_{eq}$ is changed, the delay time produced by the delay circuit 210 is also changed accordingly.

Figure 3:
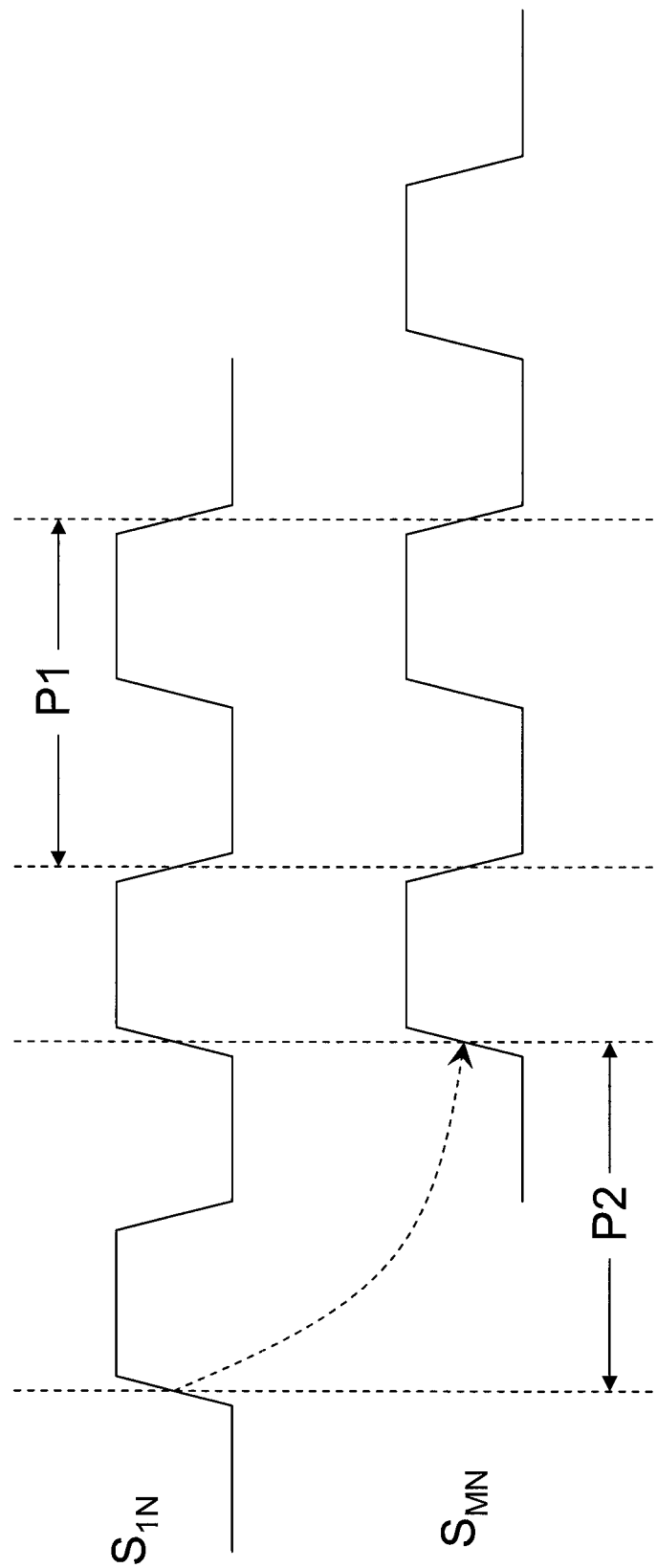
FIG. 3 is a timing diagram of an input signal and an output signal in FIG. 2.

To be more specific, the delay time between the input signal $S_{IN}$ and the output signal $S_{MN}$ is related to the capacitance of the equivalent capacitor $C_{eq}$ (i.e., the equivalent capacitance of the delay circuit 210) and the resistance of the equivalent resistor $R_{eq}$. FIG. 3 is a timing diagram of the input signal $S_{IN}$ and the output signal $S_{MN}$ in FIG. 2. In the present embodiment, the input signal $S_{IN}$ and the output signal $S_{MN}$ are respectively a clock signal, and the period thereof is P1. The timing of the output signal $S_{MN}$ falls behind that of the input signal $S_{IN}$, and the delay time between the input signal $S_{IN}$ and the output signal $S_{MN}$ is P2. Herein the delay time P2 is related to the capacitance of the equivalent capacitor $C_{eq}$ and the resistance of the equivalent resistor $R_{eq}$. In the present embodiment, the resistance of the equivalent resistor $R_{eq}$ is adjusted according to the control signal $S_C$ to make the delay time P2 equal to a predetermined delay. Because the capacitance of the equivalent capacitor $C_{eq}$ is well-controlled, the resistance of the equivalent resistor $R_{eq}$ can be adjusted to a predetermined value when the delay time P2 is equal to the predetermined delay.

In an embodiment of the invention, the predetermined delay is N times of half of the period P1, wherein N is a positive integer. For example, the predetermined delay may be one, half, or 3⁄2 of the period P1. However, the invention is not limited thereto, and the predetermined delay can be determined according to the actual design requirement to obtain a desired resistance of the equivalent resistor $R_{eq}$ through calibration.

In an embodiment of the invention, the input signal $S_{1N}$ may be generated by a crystal oscillator, and the equivalent capacitor $C_{eq}$ may be composed of a metal oxidation semiconductor (MOS) which has its source, drain, and bulk coupled with each other. In this embodiment, the input signal $S_{1N}$ generated by the crystal oscillator has a very accurate period P1, and the capacitor composed of a MOS has a very stable capacitance. Thus, when the resistance of the equivalent resistor $R_{eq}$ is adjusted to make the delay time P2 equal to the predetermined delay, the adjusted resistance of the equivalent resistor $R_{eq}$ is substantially equal to the expected resistance.

Figure 4:
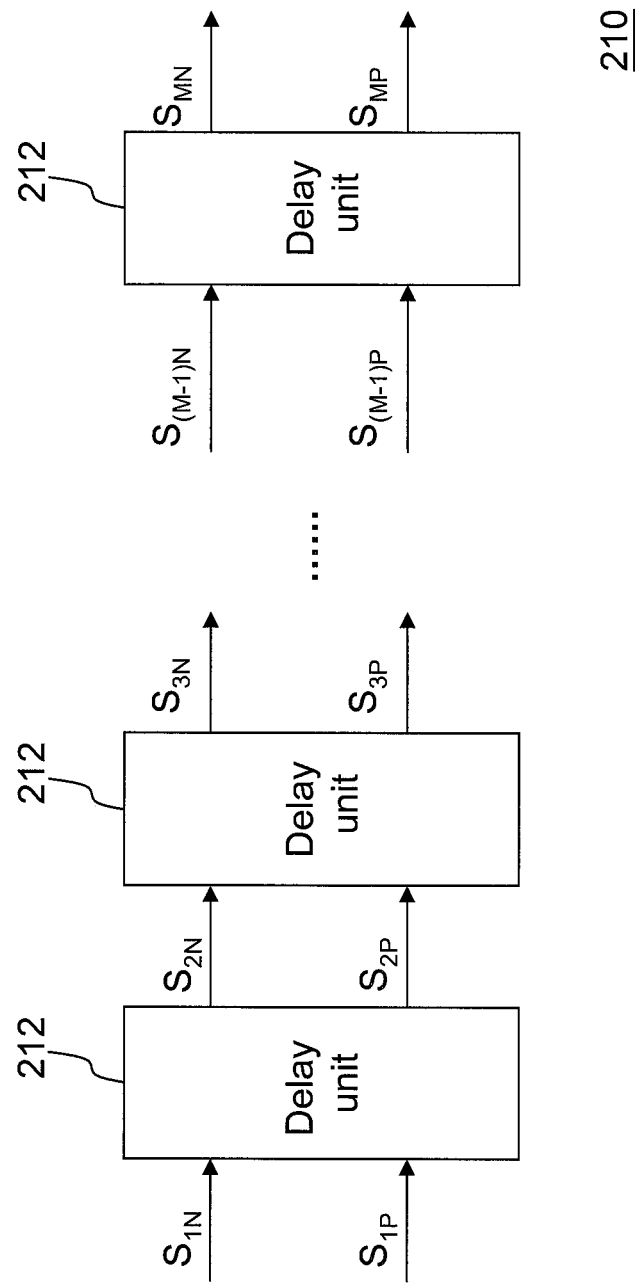
FIG. 4 is a functional block diagram of a delay circuit in a calibration circuit according to an embodiment of the invention.

In an embodiment of the invention, the delay circuit 210 comprises a plurality of delay units. FIG. 4 is a functional block diagram of a delay circuit 210 in a calibration circuit according to an embodiment of the invention. In the present embodiment, the delay circuit 210 comprises a plurality of delay units 212 that are connected with each other. Each of the delay units 212 is controlled by the control signal $S_C$ and configured to delay and output a signal. For example, the first delay unit 212 delays signals $S_{1N}$ and $S_{1P}$ to output signals $S_{2N}$ and $S_{2P}$, the second delay unit 212 delays the signals $S_{2N}$ and $S_{2P}$ to output signals $S_{3N}$ and $S_{3P}$, and the last delay unit 212 delays the signals $S_{(M-1)N}$ and $S_{(M-1)P}$ to output signals $S_{MN}$ and $S_{MP}$. In the present embodiment, the signals $S_{1N}$ and $S_{1P}$ are complementary to each other, the signals $S_{2N}$ and $S_{2P}$ are complementary to each other, the signals $S_{3N}$ and $S_{3P}$ are complementary to each other, . . . , the signals $S_{(M-1)N}$ and $S_{(M-1)P}$ are complementary to each other, and the signals $S_{MN}$ and $S_{MP}$ are complementary to each other. Because the delay units 212 of the delay circuit 210 are connected with each other, the delay time P2 of the delay circuit 210 is equal to the total of the delay time of all the delay units 212. For example, assuming that the delay circuit 210 has M delay units 212 and the delay time of each delay unit 212 is $\Delta T$, the delay time P2 is then (M×$\Delta T$). It should be understood that in the embodiment described above, the delay units 212 have the same delay time. However, the invention is not limited thereto, and in another embodiment of the invention, the delay units 212 of the delay circuit 210 have different delay time.

Even though foregoing embodiment is described by assuming that the delay circuit 210 comprises multiple delay units 212, the invention is not limited thereto, and in another embodiment of the invention, the delay circuit 210 comprises only one delay unit 212, wherein the single delay unit 212 receives and delays the input signals $S_{1N}$ and $S_{1P}$ and outputs the output signals $S_{MN}$ and $S_{MP}$.

Figure 5:
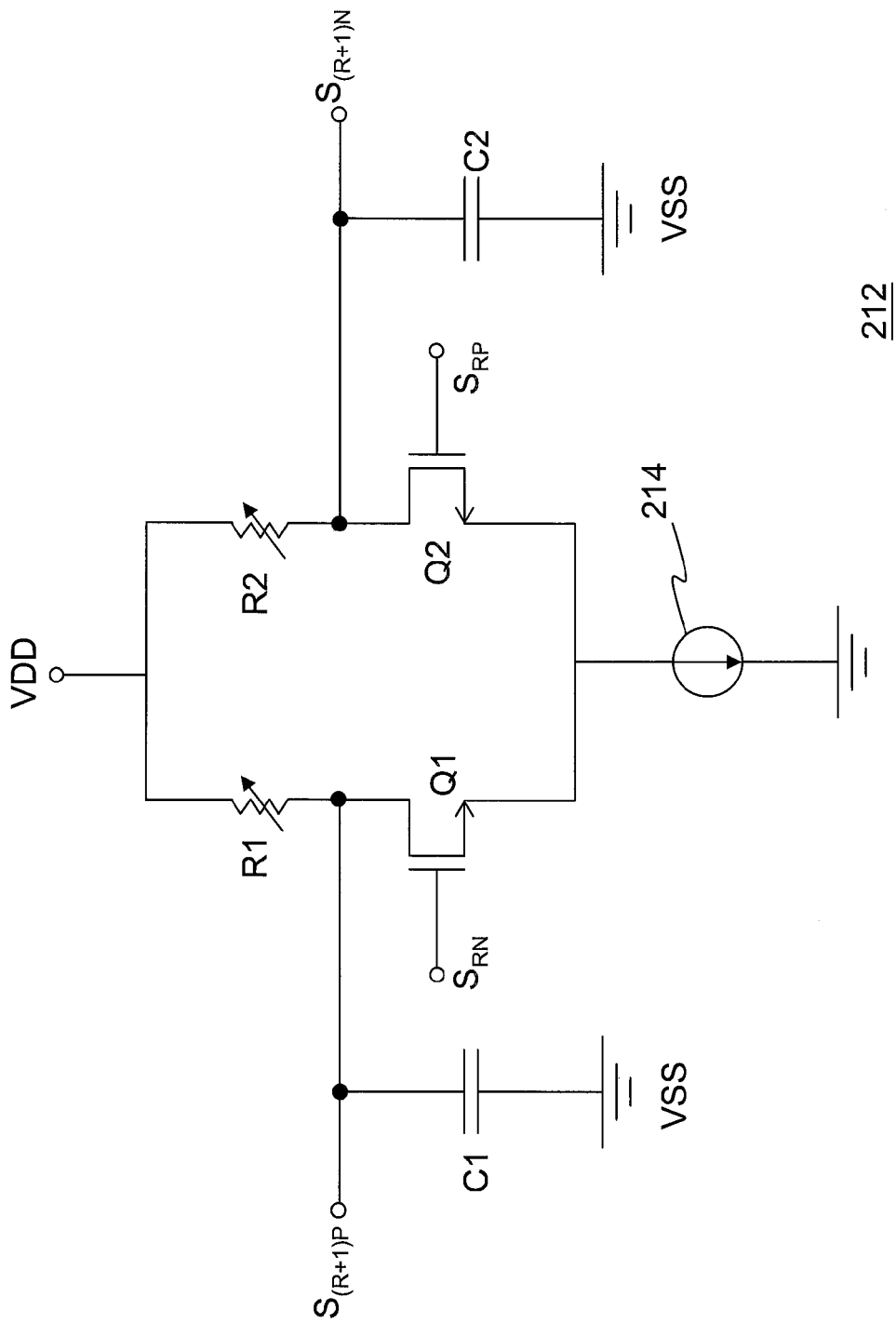
FIG. 5 is a circuit diagram of a delay unit according to an embodiment of the invention.

FIG. 5 is a circuit diagram of the delay unit 212 according to an embodiment of the invention. Referring to FIG. 5, the delay unit 212 comprises a first variable resistor R1, a second variable resistor R2, a first capacitor C1, a second capacitor C2, a current source 214, a first switch Q1, and a second switch Q2. The first variable resistor R1 and the second variable resistor R2 are coupled to the first system voltage VDD, and the resistances of the first variable resistor R1 and the second variable resistor R2 are both controlled by the control signal $S_C$. The first end of the first capacitor C1 is coupled to the first variable resistor R1, and the second end of the first capacitor C1 is coupled to a second system voltage VSS. The first end of the second capacitor C2 is coupled to the second variable resistor R2, and the second end of the second capacitor C2 is coupled to the second system voltage VSS. In the present embodiment, the first system voltage VDD is a positive voltage, the second system voltage VSS is a ground voltage, and each of the first switch Q1 and the second switch Q2 is an N-type metal-oxide-semiconductor (NMOS). The first terminal (drain) of the first switch Q1 is coupled to the first variable resistor R1 and the first end of the first capacitor C1, the second terminal (source) of the first switch Q1 is coupled to the first terminal of the current source 214, and the control terminal (gate) of the first switch Q1 receives a signal $S_{RN}$. The first terminal (drain) of the second switch Q2 is coupled to the second variable resistor R2 and the first end of the second capacitor C2, the second terminal (source) of the second switch Q2 is coupled to the first terminal of the current source 214, and the control terminal (gate) of the second switch receives a signal $S_{RP}$ which is complementary to the signal $S_{RN}$. The current source 214 provides a current, and the second terminal of the current source 214 is coupled to the second system voltage VSS.

The signal $S_{RN}$ may be one of the signals $S_{1N}$-$S_{MN}$ in FIG. 4, and the signal $S_{RP}$ is complementary to the signal $S_{RN}$. In other words, the variable R may be an integer between 1 and (M−1). Referring to FIG. 5 again, the delay unit 212 delays the signals $S_{RN}$ and $S_{RP}$ to output the signals $S_{(R+1)N}$ and $S_{(R+1)P}$, wherein the timing of the signals $S_{(R+1)N}$ and $S_{(R+1)P}$ falls behind that of the signals $S_{RN}$ and $S_{RP}$.

In an embodiment in which the delay circuit 210 comprises a single delay unit 212, the signals $S_{RN}$ and $S_{RP}$ in FIG. 5 are the input signals $S_{1N}$ and $S_{1P}$, and the signals $S_{RN}$ and $S_{RP}$ in FIG. 5 are the output signals $S_{MN}$ and $S_{MP}$. Thus, in this embodiment, the control terminal (gate) of the first switch Q1 receives the input signal $S_{1N}$, and the control terminal (gate) of the second switch Q2 receives the signal $S_{1P}$ which is complementary to the input signal $S_{1N}$.

Additionally, in an embodiment in which the delay circuit 210 comprises multiple delay units 212 that are connected with each other, the input signals $S_{RN}$ and $S_{RP}$ of each delay unit 212 are the output signals of the previous delay unit 212 or the input signals $S_{1N}$ and $S_{1P}$, and the output signals $S_{(R+1)N}$ and $S_{(R+1)P}$ of each delay unit 212 are the input signals of the next delay unit 212 or the output signals $S_{MN}$ and $S_{MP}$. In this embodiment, the control terminal (gate) of the first switch Q1 receives the input signal $S_{IN}$ or is coupled to the first end of the second capacitor C2 of one of the delay units 212 (i.e., the previous delay unit 212), and the control terminal (gate) of the second switch Q2 receives the signal $S_{1P}$ complementary to the input signal $S_{1N}$ or is coupled to the first end of the first capacitor C1 of one of the delay units 212 (i.e., the previous delay unit 212).

Figure 6:
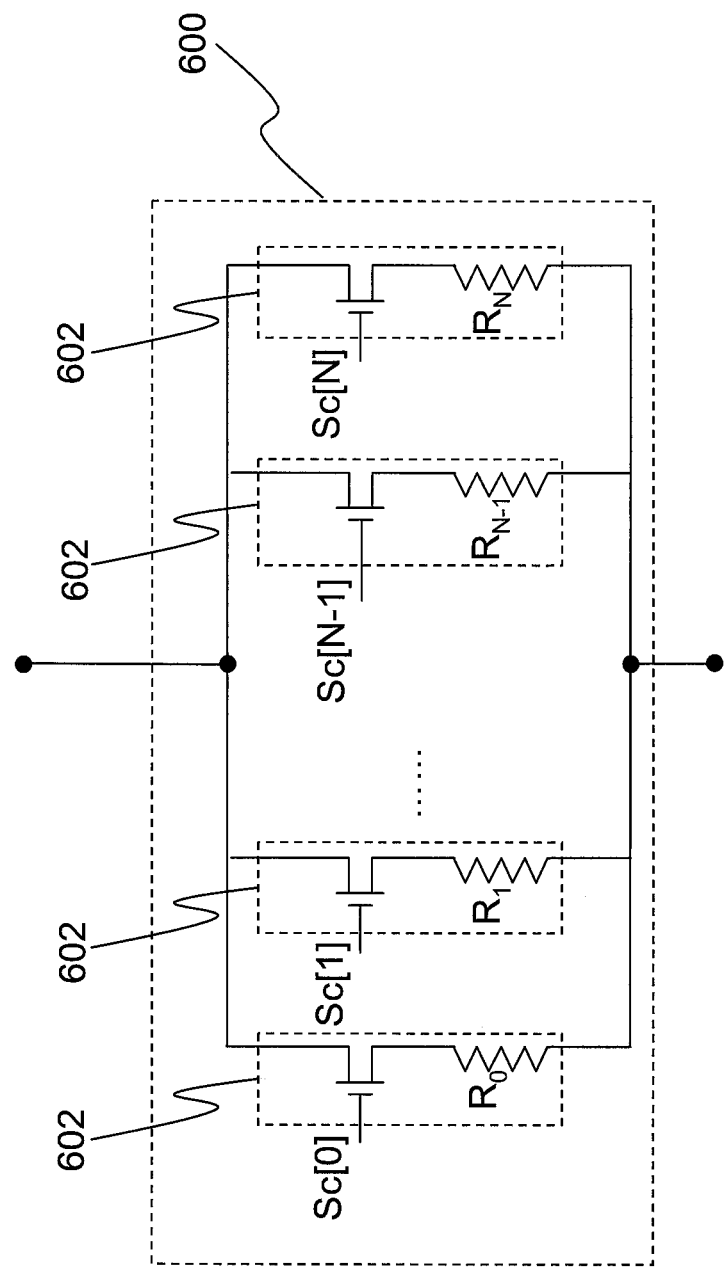
FIG. 6 is a circuit diagram of a variable resistor in a delay circuit according to an embodiment of the invention.

Referring to FIG. 2 and FIG. 5 again, in some embodiments of the invention, the equivalent resistor $R_{eq}$ in FIG. 2 may be composed of multiple resistor units, and the first variable resistor R1 and the second variable resistor R2 in FIG. 5 may be composed of multiple resistor units. FIG. 6 is a circuit diagram of a variable resistor 600 in the delay circuit 210 according to an embodiment of the invention. The equivalent resistor $R_{eq}$ in FIG. 2 and the first variable resistor R1 and the second variable resistor R2 in FIG. 5 can all be implemented as the variable resistor 600 in FIG. 6. However, the invention is not limited thereto, and those having ordinary knowledge in the art should understand that the equivalent resistor $R_{eq}$ in FIG. 2 and the first variable resistor R1 and the second variable resistor R2 in FIG. 5 may also be implemented in other ways. The variable resistor 600 comprises a plurality of resistor units 602 which are connected with each other in parallel, and each of the resistor units 602 comprises a resistor (one of the resistors $R_0$-$R_N$) and a switch composed of a transistor. In the present embodiment, the control signal $S_C$ is a digital signal having (N+1) bits, and which can be indicated as $S_C[0:N]$. Each of the bits $S_C[0]$-$S_C[N]$ of the control signal $S_C$ is used for controlling the switch of a corresponding one of the resistor units 602, and the variable resistor 600 has different equivalent resistance along with different on/off states of the switches of the resistor units 602. Accordingly, the equivalent resistance of the variable resistor 600 is controlled by the control signal $S_C$.

Figure 7:
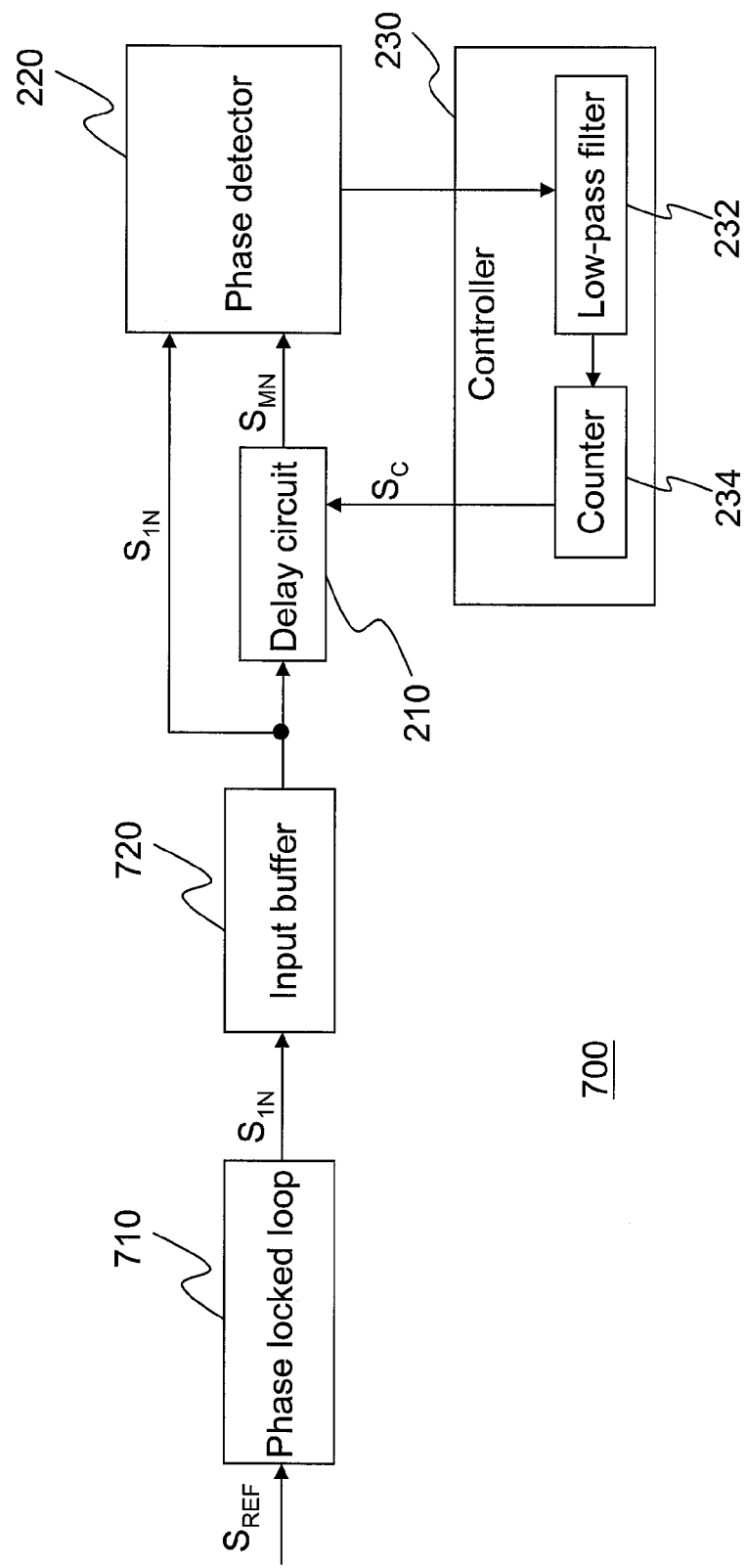
FIG. 7 is a functional block diagram of a calibration circuit according to an embodiment of the invention.

FIG. 7 is a functional block diagram of a calibration circuit 700 according to an embodiment of the invention. Referring to FIG. 7, similar to the calibration circuit 200 illustrated in FIG. 2, the calibration circuit 700 also has a delay circuit 210, a phase detector 220, and a controller 230. The functions of the delay circuit 210, the phase detector 220, and the controller 230 in FIG. 7 are the same as those of the delay circuit 210, the phase detector 220, and the controller 230 in FIG. 2, and therefore will not be described herein. In the present embodiment, the calibration circuit 700 further comprises a phase locked loop 710 coupled to the delay circuit 210. The phase locked loop 710 receives a reference signal $S_{REF}$ to generate and output the input signal $S_{1N}$ to the delay circuit 210, wherein the frequency of the input signal $S_{1N}$ may be higher than that of the reference signal $S_{REF}$. Additionally, in another embodiment of the invention, the calibration circuit 700 may further include an input buffer 720 coupled between the phase locked loop 710 and the delay circuit 210. The input buffer 720 buffers the input signal $S_{1N}$ and inputs it to the delay circuit 210. Moreover, in an embodiment of the invention, the controller 230 comprises a low-pass filter 232 and a counter 234. The low-pass filter 232 is coupled to the phase detector 220 and configured to low-pass filter the output of the phase detector 220. The counter 234 is coupled between the low-pass filter 232 and the delay circuit 210 and configured to generate and output the corresponding control signal $S_C$ according to the output of the low-pass filter 232.

In summary, in the invention, whether an input signal has been delayed for a predetermined delay, and accordingly, whether the equivalent resistance of a delay circuit has been calibrated to an expected value, is determined by using a phase detector. Since no additional off-chip resistor is required to calibrate the equivalent resistance of the delay circuit, no additional pin for coupling aforementioned off-chip resistor needs to be disposed. Thereby, the calibration circuit in the invention is very suitable to a system on chip (SOC).

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A calibration circuit, comprising:
a delay circuit, delaying an input signal to output an output signal, wherein a delay time between the input signal and the output signal is related to an equivalent capacitance and an equivalent resistance of the delay circuit;
a phase detector, coupled to the delay circuit, comparing phases of the input signal and the output signal to obtain a comparison result; and
a controller, coupled to the delay circuit and the phase detector, generating a control signal according to the comparison result of the phase detector to adjust the equivalent resistance of the delay circuit,
wherein the delay circuit has a delay unit, and the delay unit comprises:
a first variable resistor, coupled to a first system voltage, wherein a resistance of the first variable resistor is controlled by the control signal;
a second variable resistor, coupled to the first system voltage, wherein a resistance of the second variable resistor is controlled by the control signal;
a first capacitor, having a first end coupled to the first variable resistor for outputting a signal complementary to the input signal, and having a second end coupled to a second system voltage;
a second capacitor, having a first end coupled to the second variable resistor for outputting the output signal, and having a second end coupled to the second system voltage;
a first switch, having a first terminal coupled to the first variable resistor and the first end of the first capacitor, and having a control terminal for receiving the input signal;
a second switch, having a first terminal coupled to the second variable resistor and the first end of the second capacitor, and having a control terminal for receiving the signal complementary to the input signal; and
a current source, having a first terminal coupled to a second terminal of the first switch and a second terminal of the second switch, and having a second terminal coupled to the second system voltage.

2. The calibration circuit according to claim 1, wherein the control signal is a digital signal having a plurality of bits, the delay circuit comprises a plurality of resistor units, and each of the resistor units comprises:
a resistor; and
a switch, connected with the resistor in series and controlled by a corresponding one of the bits of the control signal.

3. The calibration circuit according to claim 1 further comprising:
a phase locked loop, coupled to the delay circuit, receiving a reference signal to generate and output the input signal to the delay circuit.

4. The calibration circuit according to claim 3 further comprising:
an input buffer, coupled between the phase locked loop and the delay circuit, for buffering the input signal input to the delay circuit.

5. The calibration circuit according to claim 1, wherein the controller comprises:
a low-pass filter, coupled to the phase detector, low-pass filtering an output of the phase detector; and
a counter, coupled between the low-pass filter and the delay circuit, outputting the control signal according to an output of the low-pass filter.

6. The calibration circuit according to claim 1, wherein the input signal and the output signal are respectively a clock signal.

7. A calibration circuit, comprising:
a delay circuit, delaying an input signal to output an output signal, wherein a delay time between the input signal and the output signal is related to an equivalent capacitance and an equivalent resistance of the delay circuit;
a phase detector, coupled to the delay circuit, comparing phases of the input signal and the output signal to obtain a comparison result; and
a controller, coupled to the delay circuit and the phase detector, generating a control signal according to the comparison result of the phase detector to adjust the equivalent resistance of the delay circuit, wherein the delay circuit has a plurality of delay units connected with each other, and each of the delay units comprises:
  a first variable resistor, coupled to a first system voltage, wherein a resistance of the first variable resistor is controlled by the control signal;
  a second variable resistor, coupled to the first system voltage, wherein a resistance of the second variable resistor is controlled by the control signal;
  a first capacitor, having a first end coupled to the first variable resistor, and having a second end coupled to a second system voltage;
  a second capacitor, having a first end coupled to the second variable resistor, and having a second end coupled to the second system voltage;
  a current source, providing a current, having a second terminal coupled to the second system voltage;
  a first switch, having a first terminal coupled to the first variable resistor and the first end of the first capacitor, having a second terminal coupled to a first terminal of the current source, and having a control terminal for receiving the input signal or coupled to the first end of the second capacitor of one of the delay units; and
  a second switch, having a first terminal coupled to the second variable resistor and the first end of the second capacitor, having a second terminal coupled to the first terminal of the current source, and having a control terminal for receiving a signal complementary to the input signal or coupled to the first end of the first capacitor of one of the delay units.

8. The calibration circuit according to claim 7, wherein the control signal is a digital signal having a plurality of bits, the first variable resistor and the second variable resistor respectively comprise a plurality of resistor units, and each of the resistor units comprises:
  a resistor; and
  a switch, connected with the resistor in series and controlled by a corresponding one of the bits of the control signal.

* * * * *